US012656179B2

(12) United States Patent
Duqi et al.

(10) Patent No.: US 12,656,179 B2
(45) Date of Patent: Jun. 16, 2026

(54) PROCESS FLOW FOR THIN CONTACTLESS THERMAL SENSORS

(71) Applicant: STMicroelectronics International N.V., Geneva (CH)

(72) Inventors: Enri Duqi, Milan (IT); Giorgio Allegato, Monza (IT)

(73) Assignee: STMicroelectronics International N.V., Geneva (CH)

( * ) Notice: Subject to any disclaimer, the term of this patent is extended or adjusted under 35 U.S.C. 154(b) by 587 days.

(21) Appl. No.: 18/108,154

(22) Filed: Feb. 10, 2023

(65) Prior Publication Data

US 2024/0272004 A1 Aug. 15, 2024

(51) Int. Cl.
    G01J 5/10 (2006.01)
    B81B 7/00 (2006.01)
    B81C 1/00 (2006.01)

(52) U.S. Cl.
    CPC .............. G01J 5/10 (2013.01); B81B 7/0038 (2013.01); B81B 7/007 (2013.01); B81C 1/00285 (2013.01); B81C 1/00301 (2013.01); B81B 2201/0278 (2013.01); B81B 2207/012 (2013.01); B81B 2207/07 (2013.01); B81B 2207/097 (2013.01); B81C 2203/0109 (2013.01); B81C 2203/0792 (2013.01); G01J 2005/106 (2013.01)

(58) Field of Classification Search
    CPC ........ G01J 5/10; G01J 2005/106; G01J 5/045; B81C 1/00285; B81C 1/00301; B81C 2203/0109; B81C 2203/0792; B81C 2203/036; B81B 7/0038; B81B 7/007; B81B 2201/0278; B81B 2207/012; B81B 2207/07; B81B 2207/097; B81B 7/0067; B81B 2201/0207
    USPC .......................................................... 438/54
    See application file for complete search history.

(56) References Cited

U.S. PATENT DOCUMENTS 9,036,231 B2 * 5/2015 Zhou .................... G02B 26/101
    359/199.2
2011/0315880 A1 12/2011 Nemirovsky
(Continued)

FOREIGN PATENT DOCUMENTS

CN 113086938 A 7/2021

OTHER PUBLICATIONS

Avraham, Moshe, et al.: "Wafer-Level Packaged CMOS-SOI-MEMS Thermal Sensor at Wide Pressure Range for IoT Applications," Engineering Proceedings, MDPI, 2020, 2, 30; doi.10.3390/ecsa-7-08191, 7 pgs.

(Continued)

*Primary Examiner* — Moazzam Hossain
(74) *Attorney, Agent, or Firm* — Crowe & Dunlevy LLC

(57) ABSTRACT

Disclosed herein is a method of forming a thermal sensor, including patterning an active layer on a first face of a handle substrate to form a frame, a mass carrying at least one thermally isolated MOS (TMOS) transistor, and a spring structure connecting the mass to the frame while thermally isolating the mass from the frame. The frame is then bonded to pads on a first face of an integrated circuit substrate. The handle substrate is removed, and a top cap is bonded to the first face of the integrated circuit substrate to enclose at least the mass and spring within the sealed cavity.

19 Claims, 8 Drawing Sheets

(56) References Cited

U.S. PATENT DOCUMENTS

| | | | |
|---|---|---|---|
| 2012/0099176 A1* | 4/2012 | Zhou ................. | G02B 26/0841 |
| | | | 359/290 |
| 2016/0163942 A1 | 6/2016 | Emadi et al. | |
| 2019/0207053 A1 | 7/2019 | Nemirovsky et al. | |
| 2020/0235251 A1* | 7/2020 | Seghizzi ............. | B81C 1/00238 |
| 2022/0283034 A1 | 9/2022 | Schieferdecker et al. | |

OTHER PUBLICATIONS

Gitelman, L., et al.: "CMOS-SOI-MEMS Transistor for Uncooled IR Imaging," IEEE Transactions on Electron Devices, vol. 56, No. 9, Sep. 2009, 8 pgs.

* cited by examiner

PROCESS FLOW FOR THIN CONTACTLESS THERMAL SENSORS

TECHNICAL FIELD

This disclosure is directed to the field of thermal sensing devices and, more particularly, to a process flow for forming thermally isolated MOS sensors (TMOS).

BACKGROUND

Thermal sensors are used in a variety of devices to determine the temperature of desired targets and function by sensing infrared radiation. For example, certain types of thermal sensors can be used to determine the body temperature of a human being from a distance, while other types of thermal sensors can be used to determine the body temperature of a human being by being inserted into the ear canal.

Conventionally, thermal sensing may be performed utilizing a thermocouple. A thermocouple is formed by two junctions between two dissimilar electrical conductors—a reference junction and a sensing junction. When there is a temperature difference between the sensing junction and the reference junction, a temperature-dependent voltage is generated as a result of the Seebeck effect.

Another way thermal sensing may be performed is to use an image sensor that is sensitive to electromagnetic radiation in the infrared spectrum.

Such thermal sensors described above, however, may not have all attributes desired for certain applications. For example, such devices may not meet certain requirements regarding thickness, area, yield, and the capability to be illuminated from both the front side of the sensor and the back side of the sensor. Therefore, further development in the development of thermal sensors is still required.

SUMMARY

Disclosed herein is a method of forming a thermal sensor, including: patterning an active layer on a first face of a handle substrate to form a frame, a mass carrying at least one thermally isolated MOS (TMOS) transistor, and a spring structure connecting the mass to the frame while thermally isolating the mass from the frame; bonding the frame to pads on a first face of an integrated circuit substrate; removing the handle substrate; and bonding a top cap to the first face of the integrated circuit substrate to enclose at least the mass and spring within the sealed cavity.

The bonding of the frame to the pads may be performed via metal bonding to thereby make electrical contact from the pads to the at least one TMOS sensor through a non-metal conductive path extending from the frame, through the spring, to the at least one TMOS sensor within the mass.

Electrical contact may also be made from the pads to an application specific integrated circuit (ASIC) within the integrated circuit substrate.

The bonding of the top cap to the first face of the integrated circuit substrate may be performed by glass frit bonding a sidewall of the top cap to the first face of the integrated circuit substrate.

The glass frit bonding may result in glass material expanding into a trench defined in an interior surface of the top cap.

The glass frit bonding may result in glass material expanding over a portion of the frame.

Bonding the top cap to the first face of the integrated circuit substrate may form a chamber containing the frame, spring, and mass, the chamber delimited at its top by an interior surface of the top cap, at its bottom by a cavity formed into the first face of the integrated circuit substrate, and at its sides by sidewalls of the cavity and sidewalls of the top cap.

The bonding of the top cap to the first face of the integrated circuit may be performed in a vacuum such that a pressure within the chamber is substantially at vacuum.

Prior to bonding the top cap to the first face of the integrated circuit substrate, the method may include forming a getter layer on an interior surface of the top cap about a perimeter thereof, wherein the getter layer maintains the vacuum within the chamber during operation.

The method may further include forming an anti-reflective layer on a second face of the top cap, the anti-reflective layer reducing reflection of incident infrared radiation.

The method may also include forming an anti-reflective layer on a second face of the integrated circuit substrate, the anti-reflective layer reducing reflection of incident infrared radiation.

The method may additionally include attaching a wire bonding to at least one of the pads on the first face of the integrated circuit substrate at a portion of said pad external to a chamber created between the top cap and the integrated circuit.

The method may further include attaching solder balls to at least one of the pads on the first face of the integrated circuit substrate at a portion of said pad external to a chamber created between the top cap and the integrated circuit.

Prior to patterning the active layer, the method may include forming the active layer on the first face of a handle substrate, the formation including forming the least one TMOS transistor within the active layer.

Also disclosed herein is the sensing device itself. The sensing device may include: a thermal sensor array, the thermal sensor array comprising a plurality of sub-arrays, each sub-array including an array of thermal sensors, each thermal sensor comprising a mass suspended over a cavity and between two sides of a frame by a plurality of springs, the mass containing a plurality of thermally isolated MOS (TMOS) transistors; and a reference sensor array, the reference sensor array comprising a plurality of sub-arrays, each sub-array including an array of reference sensors, each reference sensor comprising a mass suspended over a cavity and between two sides of a frame by a plurality of springs, the mass containing a plurality of thermally isolated MOS (TMOS) transistors, wherein each reference sensor includes a layer reflective to infrared radiation and that is arranged over the plurality of TMOS transistors.

The thermal sensor array may be used to sense ambient temperature within the sensing device in addition to an external temperature as indicated by incoming infrared radiation.

The reference sensor array may be usable to sense ambient temperature within the sensing device such that a difference between a sum of the ambient temperature and the external temperature and the ambient temperature alone.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown but is to be accorded the widest scope consistent with the principles and features disclosed or suggested herein.

Figure 1:
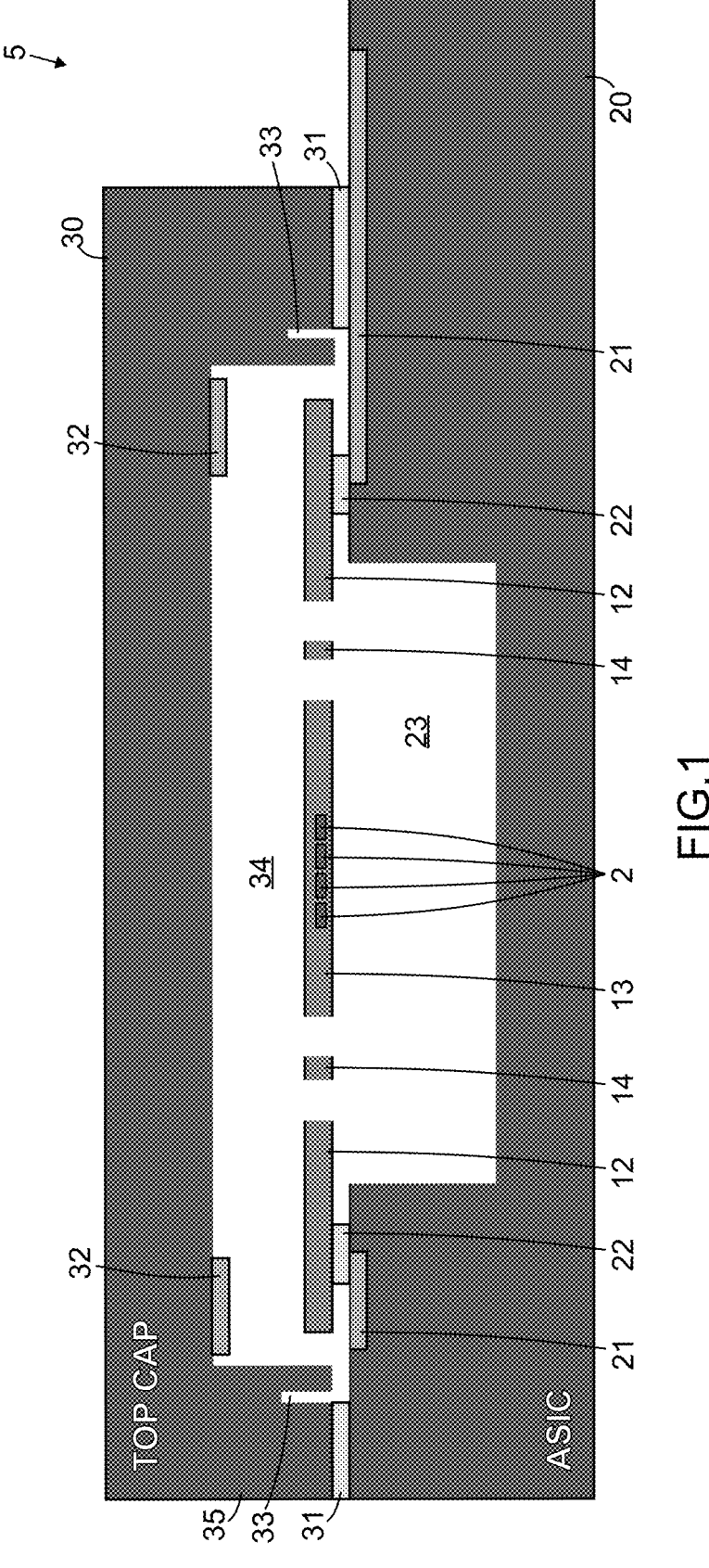
FIG. 1 is a cross-sectional view of a first embodiment of a thermal sensor disclosed herein.
Figures 9, 10:
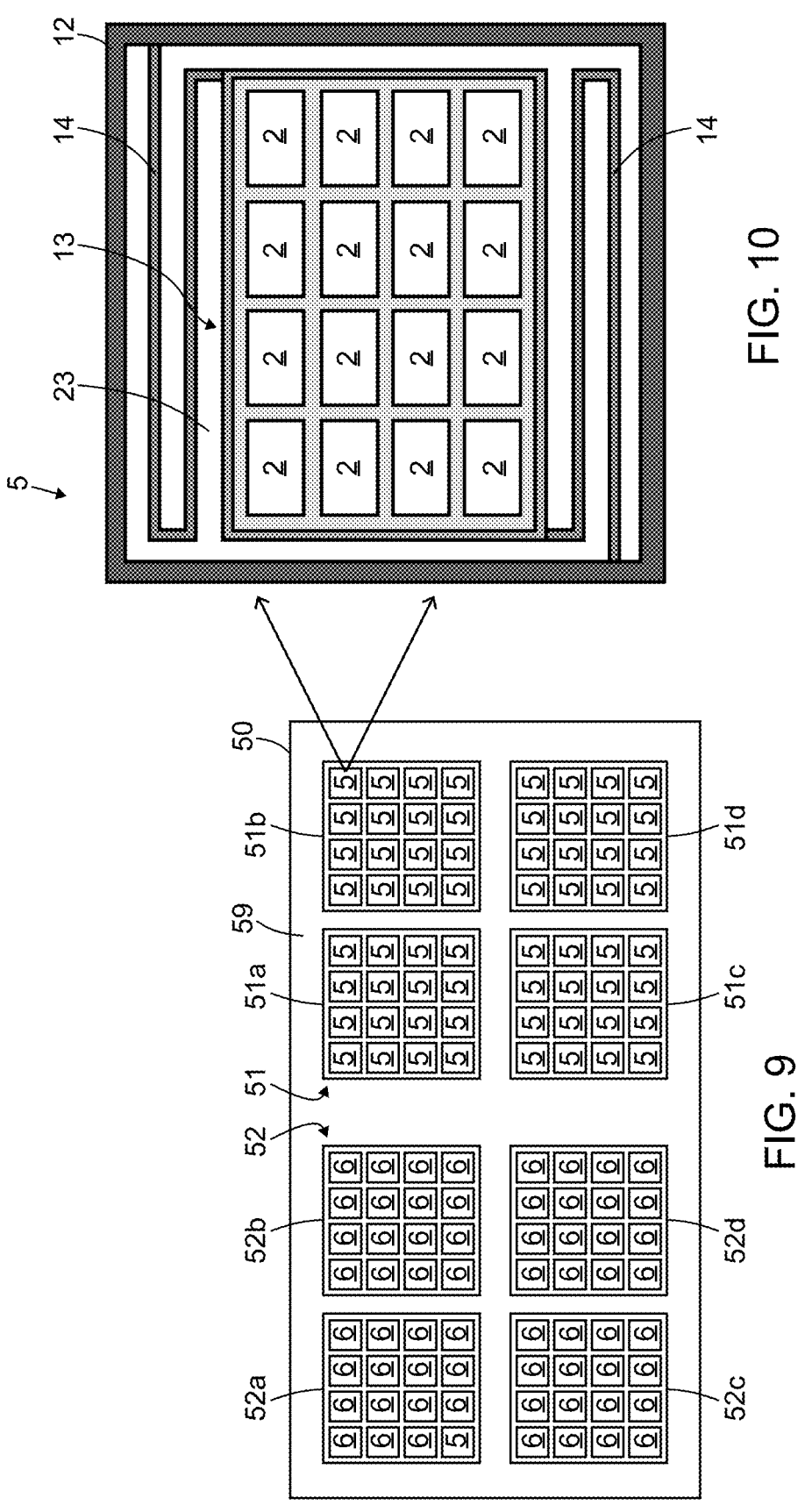
FIG. 9 is a diagrammatical view of a thermal sensing device including a sensing array of the thermal sensors disclosed herein as well as a reference array of the thermal sensors disclosed herein.
FIG. 10 is a greatly enlarged top view of one of the individual thermal sensor elementary cells of the sensing array of FIG. 9.

Now disclosed is a thermal sensor elementary cell 5, shown in cross section in FIG. 1 and shown in top view in FIG. 10.

The thermal sensor elementary cell 5 includes an ASIC 20 having a cavity 23 formed into the front face thereof and has conductive pads 21 on portions of its front face external to the cavity 23. The conductive pads 21 are for making electrical contact between components external to the ASIC 20 and circuitry within the ASIC 20. A frame 12 is mechanically and electrically connected to the pads 21 by metallic bonds 22. A mass 13 is suspended over the cavity 23 by springs 14 extending between the frame 12 and connection points at the perimeter of the mass 13. The mass 13 includes active area(s) 2 containing thermally isolated MOS sensors (TMOS).

Sidewalls 35 of a top cap 30 surround a cavity 34 defined within the bottom face of the top cap 30 and are hermetically sealed to the ASIC 20 over the cavity 23 by a glass frit bonding layer 31, with it being understood that the cavities 23 and 34 are in fluid communication but are environmentally sealed from the exterior of the thermal sensor elementary cell 5. Trenches 33 are formed in the sidewall 35 in a direction from the bottom face of the top cap 30 toward the back face of the top cap 30. A getter 32 is disposed on the interior surface of the top cap 30. In greater detail, the getter 32 is disposed on the floor of the cavity 34 (alternatively thought of as the roof of the cavity 34).

Figures 2, 3:
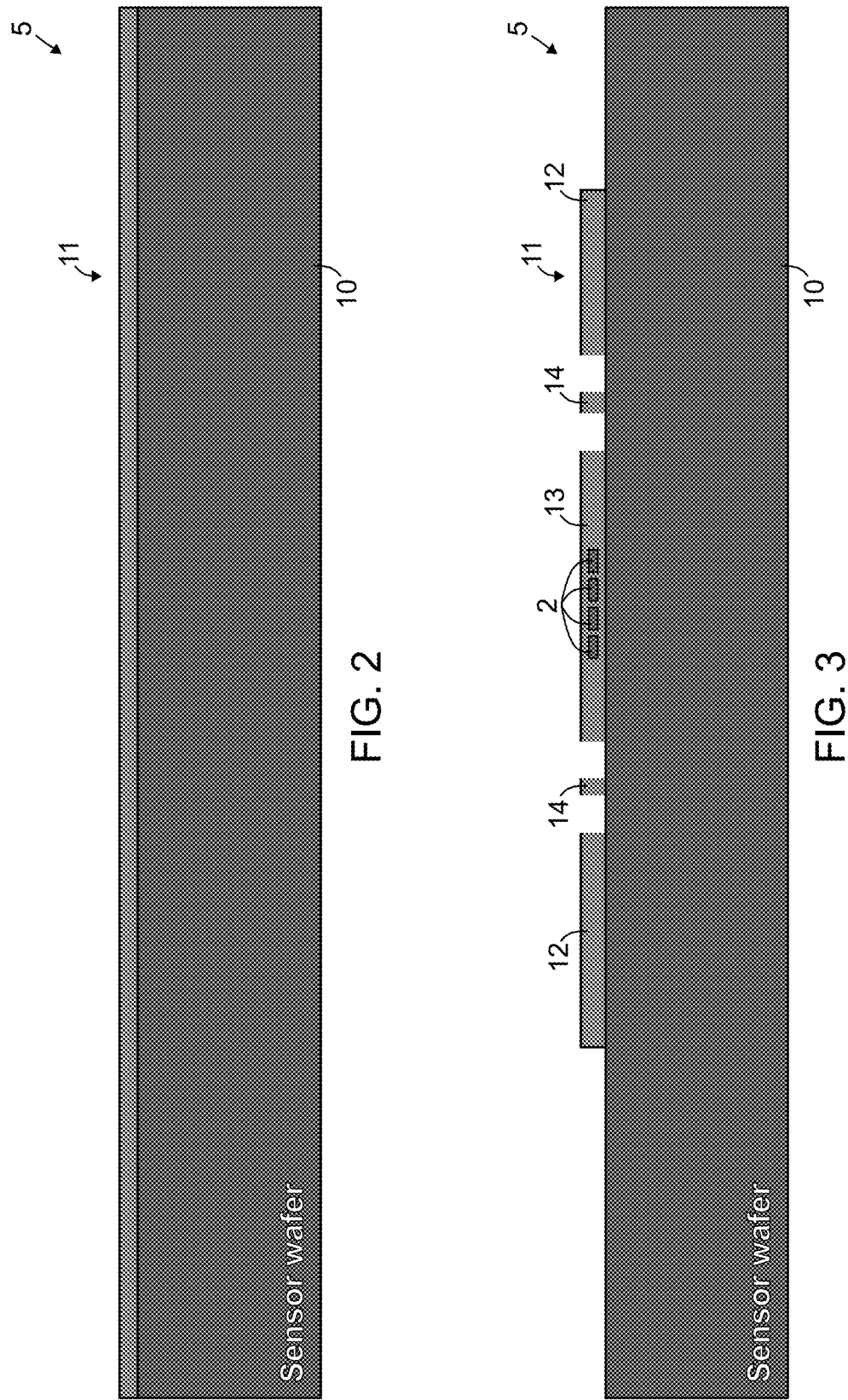
FIGS. 2-5 show a process flow for forming the first embodiment of a thermal sensor disclosed herein through a series of cross-sectional views.

A process flow for forming the thermal sensor 5 disclosed herein (and described hereinabove) is now described with reference to FIGS. 2-5. Initially, an active layer 11 is formed on a first face of a silicon substrate 10 acting as a handle, with active area(s) 2 containing thermally isolated MOS sensors (TMOS) being formed within the active layer 11, as shown in FIG. 2. The active layer 11 is then etched to form a frame 12, a mass 13 carrying the active areas 2, and a spring 14 connecting the mass 13 to the frame 12, as shown in FIG. 3. The spring 14 serves to thermally isolate the mass 13 from the frame 12 due to the spring 14 having a low thermal conductivity. A non-metal conductive path is formed within the active layer 11 during formation thereof and extends from an exposed pad on the surface of the frame 12, through the remainder of the frame 12 to the spring 14, and through the spring to the TMOS sensors within the mass 13.

Figure 4:
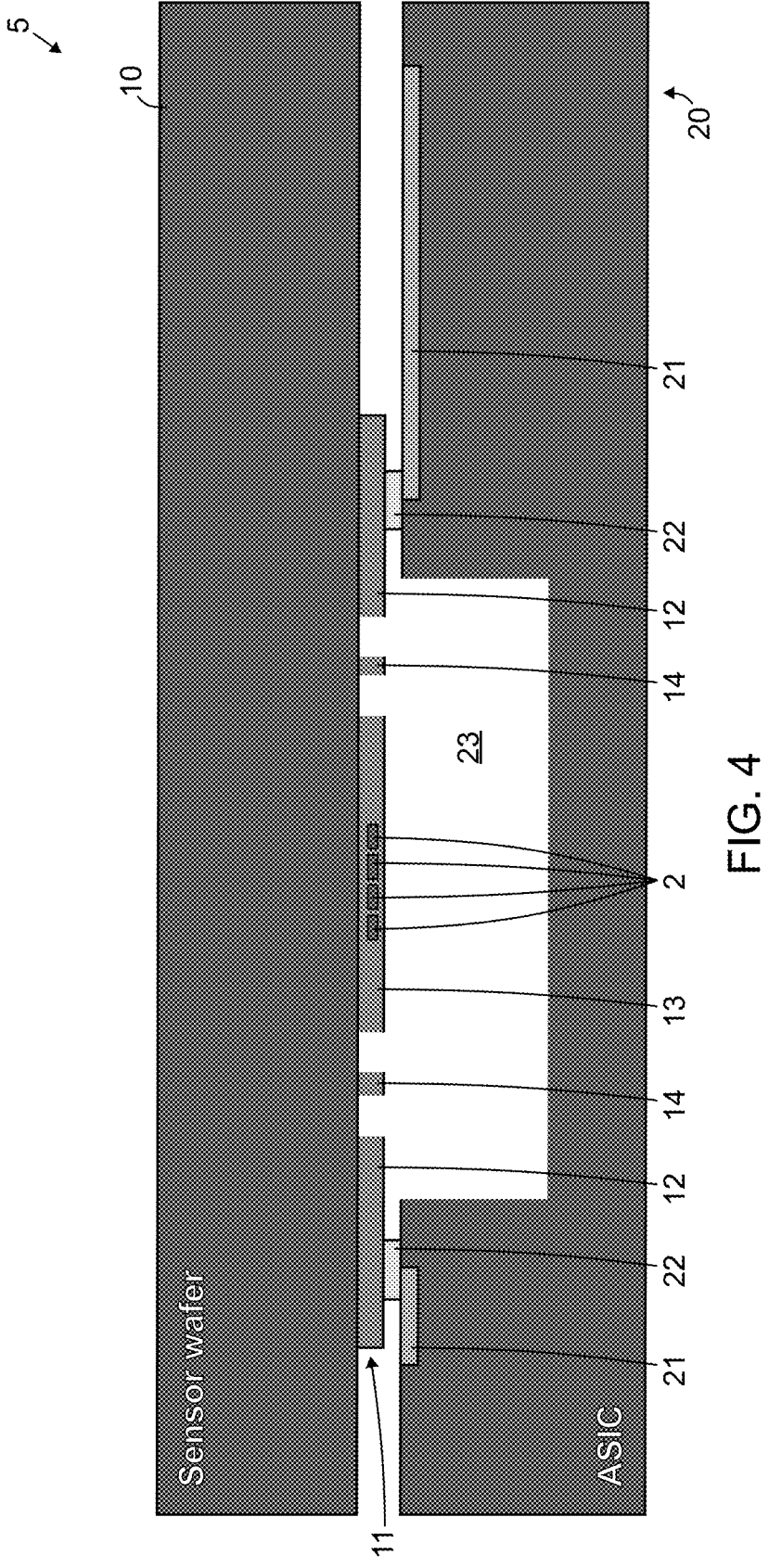
Figure 5:
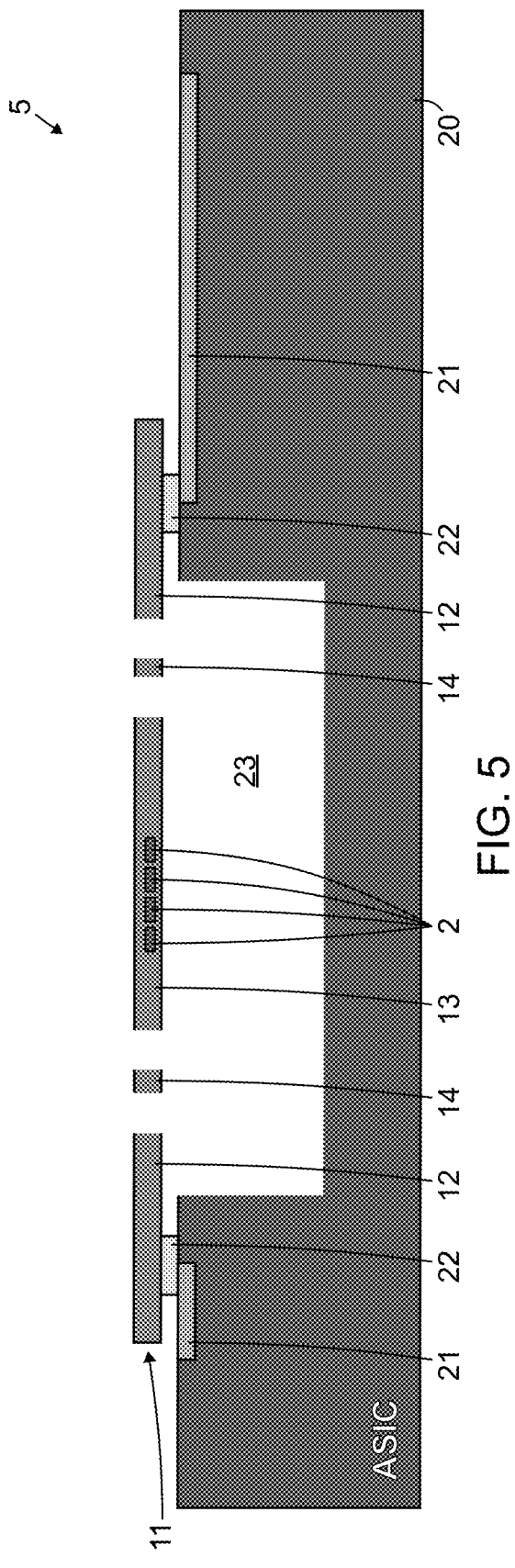

Next, the substrate 10 is flipped and its first face is bonded to the first face of an ASIC 20 formed within a silicon substrate, as shown in FIG. 4. In greater detail, the first face of the frame 12 of the active layer 11 is bonded to pads 21 on the first face of the ASIC 20 through a patterned metallic bonding layer 22 (e.g., gold or germanium), which provides for electrical contact between active components of the ASIC 20 and the above described conductive paths within the active layer 11. The substrate handle 10 is then removed, as shown in FIG. 5.

The top cap 30 is then bonded to the ASIC 20 over the frame 12, spring 14, and mass 13 through a glass frit bonding 31, as shown in FIG. 1. As explained above, the top cap has a cavity 34 formed therein, with faces of the raised sidewall 35 surrounding the perimeter of the cavity 34 being bonded to the first face of the ASIC 20 and the pads 21 (where the raised sidewall 35 overlies the pads 21) by the glass frit bonding 31.

A vacuum is present during the glass-frit bonding to achieve a vacuum within the chamber 23. Notice that a trench 33 is formed in the raised sidewall 35 of the top cap 30 to provide room for the glass frit bonding 31 to expand into during bonding without flowing onto the active layer 11, and that the trench 33 extends about the perimeter of the mass 13.

A getter layer 32 is disposed on the interior surface of the top cap 30 at positions laterally spaced apart from the mass 13. This spacing is utilized because the getter layer 32 is not transparent to infrared radiation, and therefore would obstruct infrared radiation from entering the thermal sensor 5 through the top cap 30 to reach the TMOS devices within the mass 13 if the getter layer portions were to overlie the mass 13. The getter layer 32 maintains the vacuum within the chamber 23 during operation. This completes formation of this embodiment of the thermal sensor 5.

Owing to the fact that the silicon forming the substrate 20 and top cap 30 is transparent to infrared radiation, as well as owing to the central positioning of the mass 13 containing the TMOS sensors between the sidewalls of the cavities 23 and 34 so that no components are between the mass 13 and the top cap 30 and ASIC 20, incoming infrared radiation that impinges upon the second face of the top cap 30 or the second face of the ASIC 20 can pass through to reach the TMOS sensors within the mass 13, enabling thermal sensing.

Due to the use of the substrate handle 10 to form the active layer 11, the overall thickness of the produced device 5 is less than that of prior designs, and yield is increased. In prior designs, a substrate between the top cap and ASIC carries the active layer 11. In order to achieve a desired level of thinness to meet design requirements, each of these three substrates (the ASIC, the top cap, and the substrate that carries the active layer) is thin, for example on the order of 160 microns each. With the device 5, however, because the active layer 11 is formed on the handle 10 and directly bonded to the ASIC 20 (and then the handle is removed), two substrates are present at the end (the ASIC and the top cap)—stated differently, the device 5 is formed by the top cap and ASIC, with the active layer 11 carried between the cavities 23 and 34, without an intervening substrate carrying the active layer 11. This permits the ASIC 20 and top cap 30 to be thicker than in previous designs, for example on the order of 250 microns, greatly increasing robustness and in turn reducing damage during fabrication to increase the yield.

Additionally, in prior designs utilizing the three substrates (the ASIC, the top cap, and the substrate that carries the active layer), there are two glass frit bonds performed, one between the ASIC and the substrate that carries the active layer, and one between the substrate that carries the active layer and the top cap. The coefficient of thermal expansion of the glass material is not matched to that of silicon, leading to mechanical stresses on the device. Since the prior design utilizes two glass frit bonds, it undergoes additional mechanical stresses as compared to the design described herein which utilizes a single glass frit bond. This adds to robustness and helps eliminate or reduce warping of the device.

Figure 6:
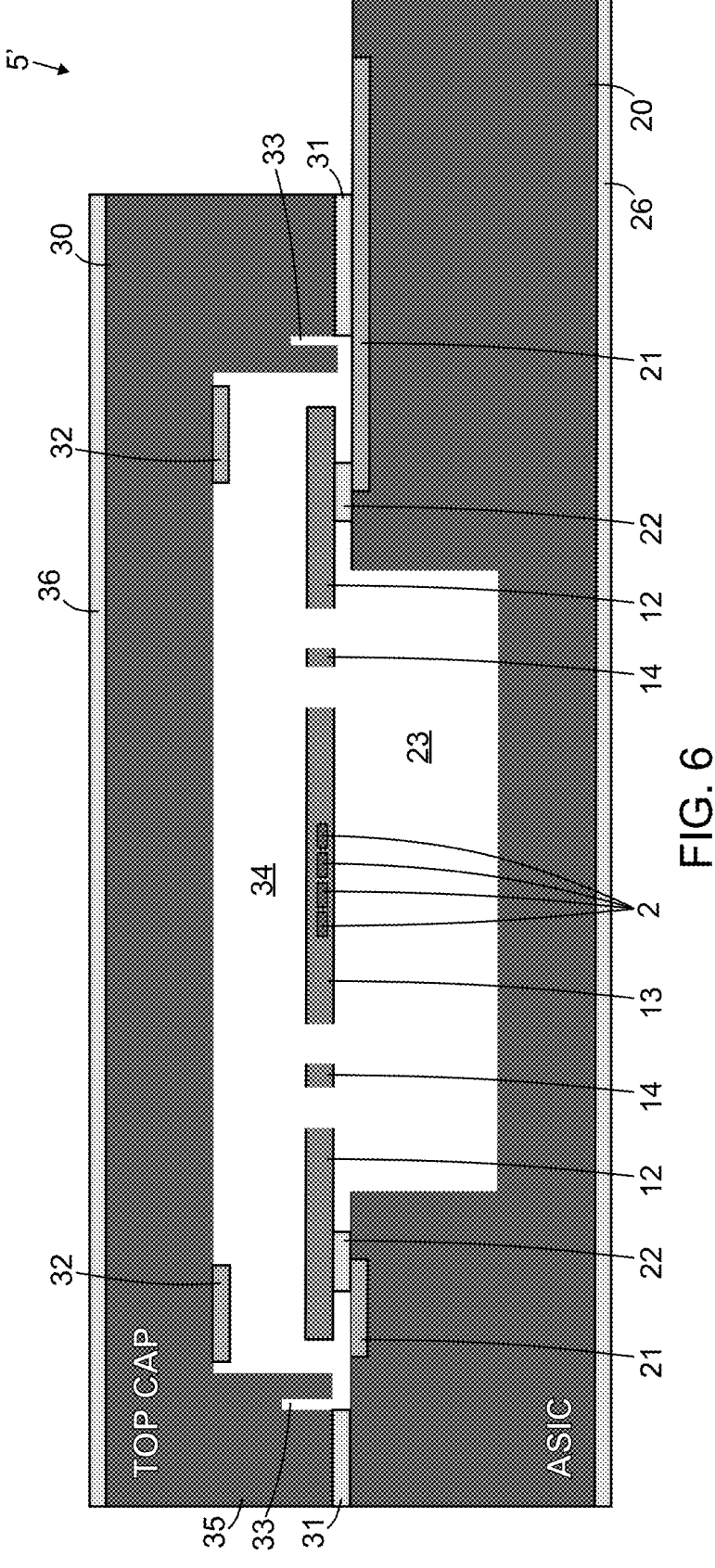
FIG. 6 is a cross-sectional view of the embodiment of the thermal sensor, with optional anti-reflective coatings added.

An anti-reflective coating 36 may be formed on the second side of the top cap 30, and similarly an anti-reflective coating 26 may be formed on the second side of the ASIC 20, as shown in FIG. 6. The anti-reflective coatings 26 and 36 serve to help ensure that incident infrared radiation does not reflect off the second side of the top cap 30 or the second side of the ASIC 20. Both anti-reflective coatings 26 and 36 need not be present, and instead only one may be present, depending upon application.

Figure 7:
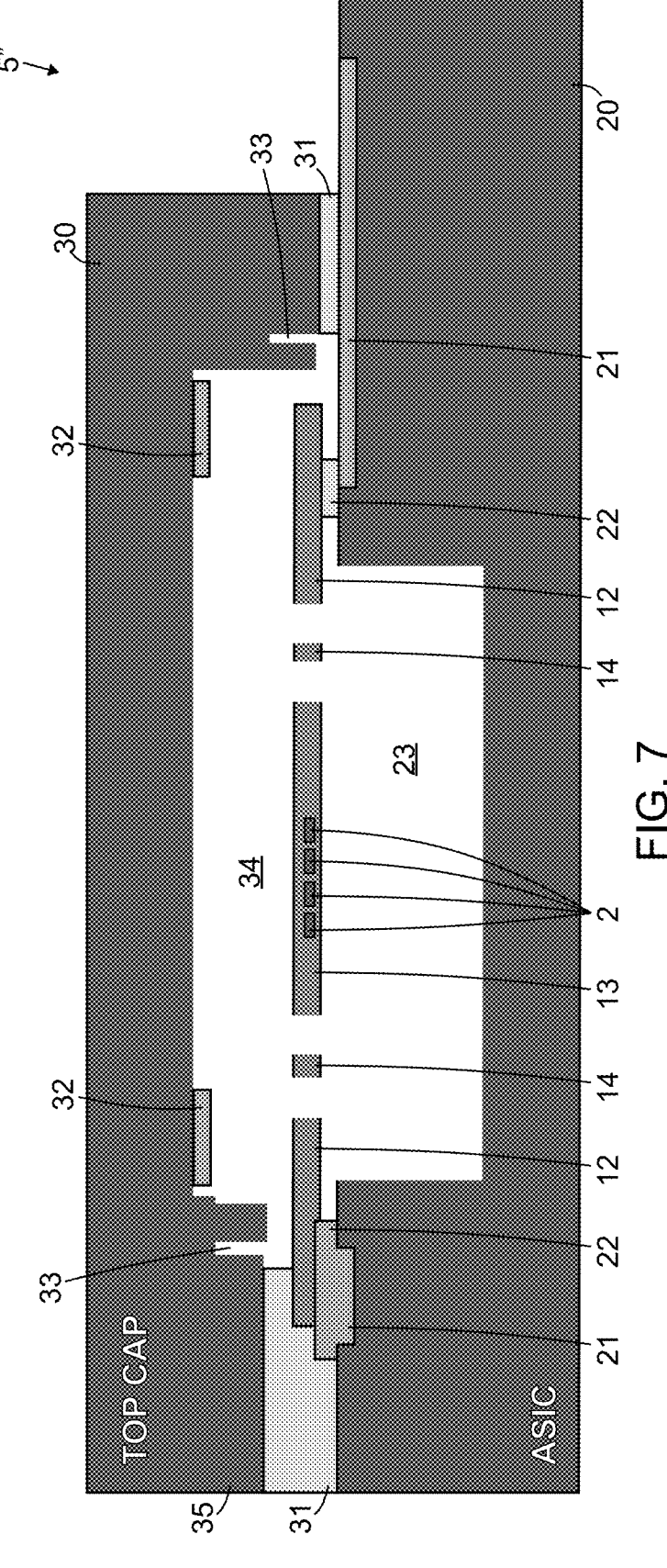
FIG. 7 is a cross-sectional view of a second embodiment of a thermal sensor disclosed herein.

In an alternative embodiment shown in FIG. 7, the glass frit bonding 31 may extend over a portion of the frame 12.

Figure 8:
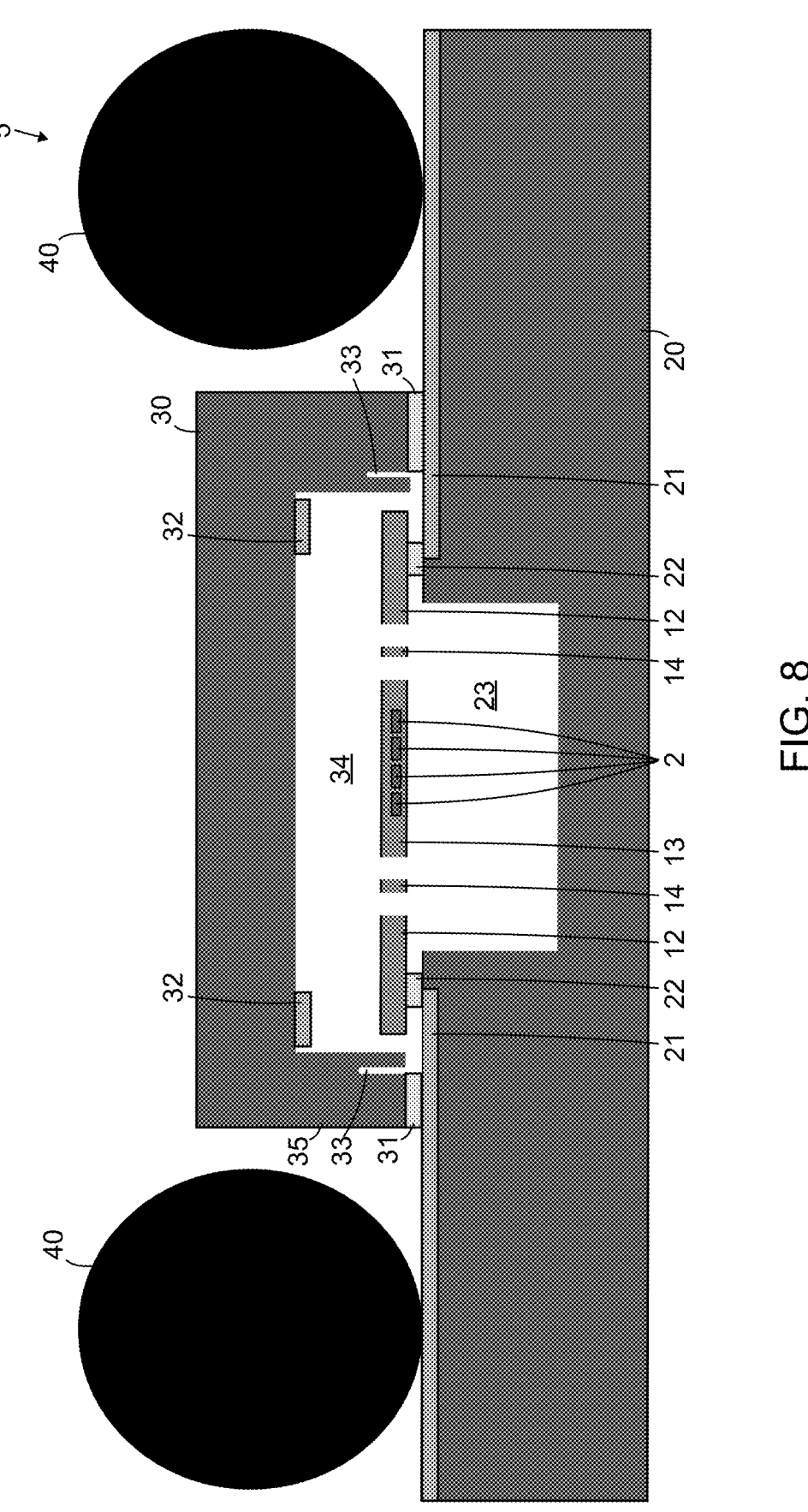
FIG. 8 is a cross-sectional view of a third embodiment of a thermal sensor disclosed herein.

In another alternative embodiment shown in FIG. 8, the pads 21 extend farther along the first side of the ASIC 20 and solder balls 40 are connected to the pads 21 external to the cap 30.

As to external connections being made to the thermal sensor 5 in the embodiments of FIGS. 5-7, exposed portions of the pads 21 may be connected to external components via wire bonding.

As will be appreciated by those of skill in the art, the thermal sensors described above may be formed at the wafer level into arrays of such thermal sensors, and multiple such arrays may be used to form a single device.

See, for example, FIG. 9, showing a single sensing device 50 with a first array 51 of thermal sensors 5 as described above and a second array 52 of reference sensors 5 identical to the thermal sensors described above but covered by material that is not transparent to infrared sensing. Therefore, the array 51 of thermal sensors 5 is used to sense ambient temperature within the device 50 in addition to the temperature/wavelength of incoming infrared radiation while the array 52 of reference sensors 6 is used to sense ambient temperature within the device 50. The difference between the ambient+incoming temperature sensed by the array 51 and the ambient temperature sensed by the array 52 yields the temperature to be sensed.

As to specific structure, the first array 51 includes four sub-arrays 51a-51d carried by a device frame 59. Wide portions of the device frame 59 space the sub-arrays 51a-51d apart from one another. Each sub-array 51a-51d itself includes an array of thermal sensor elementary cells 5, the thermal sensor elementary cells 5 being those described above and each including a frame 12, a mass 13 containing an array of TMOS transistors 2, and springs 14 connected between the frame 12 and mass 13 to suspend the mass 13 over the cavity 23. Within each sub-array 51a-51d, its pixels 5 are separated from one another by narrow frame portions.

The second array 52 includes four sub-arrays 52a-52d carried by a device frame 59. Wide portions of the device frame 59 space the sub-arrays 52a-52d apart from one another. Each sub-array 52a-52d itself includes an array of reference sensors 6, such as those described above.

Modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of forming a thermal sensor, comprising:
   patterning an active layer on a first face of a handle substrate to form a frame, a mass carrying at least one thermally isolated MOS (TMOS) transistor, and a spring structure connecting the mass to the frame while thermally isolating the mass from the frame;
   bonding the frame to pads on a first face of an integrated circuit substrate;
   completely removing the handle substrate; and
   bonding a top cap to the first face of the integrated circuit substrate to enclose at least the mass and spring within a sealed cavity.

2. The method of claim 1, wherein bonding the frame to the pads is performed via metal bonding to thereby make electrical contact from the pads to the at least one TMOS transistor through a non-metal conductive path extending from the frame, through the spring, to the at least one TMOS transistor within the mass.

3. The method of claim 2, wherein electrical contact is also made from the pads to an application specific integrated circuit (ASIC) within the integrated circuit substrate.

4. The method of claim 1, wherein bonding the top cap to the first face of the integrated circuit substrate is performed by glass frit bonding a sidewall of the top cap to the first face of the integrated circuit substrate.

5. The method of claim 4, wherein the glass frit bonding results in glass material expanding into a trench defined in an interior surface of the top cap.

6. The method of claim 4, wherein the glass frit bonding results in glass material expanding over a portion of the frame.

7. The method of claim 1, wherein bonding the top cap to the first face of the integrated circuit substrate forms a chamber containing the frame, spring, and mass, the chamber delimited at its top by an interior surface of the top cap, at its bottom by a cavity formed into the first face of the integrated circuit substrate, and at its sides by sidewalls of the cavity and sidewalls of the top cap.

8. The method of claim 7, wherein bonding the top cap to the first face of the integrated circuit is performed in a vacuum such that a pressure within the chamber is substantially at vacuum.

9. The method of claim 8, further comprising, prior to bonding the top cap to the first face of the integrated circuit substrate, forming a getter layer on an interior surface of the top cap about a perimeter thereof, wherein the getter layer is configured to maintain the vacuum within the chamber during operation.

10. The method of claim 1, further comprising forming an anti-reflective layer on a second face of the top cap, the anti-reflective layer reducing reflection of incident infrared radiation.

11. The method of claim 1, further comprising forming an anti-reflective layer on a second face of the integrated circuit substrate, the anti-reflective layer reducing reflection of incident infrared radiation.

12. The method of claim 1, further comprising attaching a wire bonding to at least one of the pads on the first face of the integrated circuit substrate at a portion of said pad external to a chamber created between the top cap and the integrated circuit.

13. The method of claim 1, further comprising attaching solder balls to at least one of the pads on the first face of the integrated circuit substrate at a portion of said pad external to a chamber created between the top cap and the integrated circuit.

14. The method of claim 1, further comprising, prior to patterning the active layer, forming the active layer on the first face of the handle substrate, wherein forming the active layer includes forming the least one TMOS transistor within the active layer.

15. A method of fabricating a thermal sensor, comprising:
bonding a patterned active layer including a mass carrying at least one thermally isolated MOS transistor and connected to a frame by a spring structure to a first face of an integrated circuit substrate;

enclosing the patterned active layer with a top cap bonded to the integrated circuit substrate to form a sealed chamber;
performing the bonding in a vacuum such that the sealed chamber is evacuated; and
depositing a getter material on an interior surface of the top cap to maintain the vacuum during operation of the sensor.

16. The method of claim 15, wherein performing the bonding comprises bonding the top cap to the integrated circuit substrate by glass frit bonding a sidewall of the top cap to the first face of the integrated circuit substrate.

17. The method of claim 16, wherein the glass frit bonding expands into a trench defined in the sidewall of the top cap.

18. The method of claim 16, wherein the glass frit bonding extends over a portion of a frame surrounding the active layer.

19. The method of claim 15, wherein the getter material is disposed on a portion of the top cap laterally spaced apart from the mass carrying the at least one thermally isolated MOS transistor.

*  *  *  *  *